United States Patent Office 2,927,011

Patented Mar. 1, 1960

2,927,011

ETCHING OF SEMICONDUCTOR MATERIALS

Richard R. Stead, Richardson, Tex., assignor to Texas Instruments Incorporated, Dallas, Tex., a corporation of Delaware No Drawing. Application July 26, 1956
Serial No. 600,164

9 Claims. (Cl. 41—42)

This invention relates to the etching of surfaces of semiconductor materials, such as germanium and silicon, in the course of preparing them for use in electrical semiconductor devices, such as diodes and transistors, and to an etching solution particularly adapted for this use.

Almost all semiconductor diodes, transistors and other such devices utilize very small blocks or bars of monocrystalline semiconductor material to which are affixed two or more electrical connections. To achieve a workable device, the bars or blocks must be treated in some fashion before the leads are attached to remove any foreign materials or contaminants from their surfaces and also to remove any crystal lattice defects on their surfaces. Such crystal lattice defects are caused by the cutting and sawing operations necessary to cut large single crystals of semiconductor material into bars and blocks of the proper size for use in semiconductor devices. Further, after the leads have been attached to the treated bars such as by alloying or electrical bonding, it is desirable to "clean" the connections by removing material not completely alloyed or bonded from around the connection since this material may bridge the connection and cause shorting.

Both of these cleaning steps are usually accomplished by subjecting the bars or blocks to an acid etching treatment. Probably the most widely used etching solution in the prior art comprises hydrofluoric acid, nitric acid, acetic acid and a small amount of bromine. This etching solution has become generally known and is referred to as CP–4.

In accordance with this invention, it has been discovered that the cleaning step may be accomplished much more expediently by the use of improved etching solutions of new composition, these solutions being composed of nitric acid, hydrofluoric acid, acetic acid and aniline. In experiments using these improved etching solutions it has been found that the solutions are far more stable than the standard CP–4 solution and etching is subject to better control without pitting of the surface of the semiconductor material. Moreover, the use of these improved etching solutions provides an improved, chemically polished surface upon which it is much easier for the observer to locate the junction between the materials of two different types of conductivity and thus the point at which a lead or leads must be attached.

Accordingly, an object of this invention is to provide an improved process for the preparation of the surfaces of semiconductor materials used in electrical semiconductor devices by etching the surfaces in a solution comprised of hydrofluoric acid, nitric acid, acetic acid and aniline.

A further object of this invention is to provide improved etching solutions which comprise hydrofluoric acid, nitric acid, acetic acid and aniline.

According to this invention, electrical semiconductors, such as silicon and germanium, can be chemically polished under controlled conditions to produce improved characteristics and finish by the use of an etching solution which consists of about 30 parts by volume of concentrated nitric acid, about 20 parts by volume of 48% hydrofluoric acid, about 40 to 80 parts by volume of glacial acetic acid and about one part by volume of aniline. In the preparation of the above solutions it is desirable to add the aniline to the acetic acid before the introduction of the nitric acid in order to prevent polymerization of the aniline. Changes in the proportion of acetic acid in the solution tend to vary the speed at which the etching takes place with slower etching rates occurring at the higher concentration of acetic acid as will be illustrated below. The etching solution of this invention performs well at room temperatures, but may be used at somewhat below room temperatures without losing its effectiveness.

It is obvious that a lesser amount of more concentrated hydrofluoric acid may replace the amounts of 48% hydrofluoric acid specified and a greater amount of weaker acetic acid may replace the glacial acetic acid without losing the effectiveness of the etching solution. However, in such cases it will be found desirable to adjust the amount of water present to bring the total concentration in line with those that will result from the mixing of the reagents specified in the concentrations and proportions as set forth above.

The following examples will indicate to those skilled in the art the superior qualities of the improved etching solutions disclosed above. In each of the examples, etching was accomplished by totally immersing the samples in the etching solution for a short period of time after which they were removed and washed with distilled water.

*Example I*

The etching solution used contained 30 parts by volume of concentrated nitric acid, 20 parts by volume of 48% hydrofluoric acid, 40 parts by volume of glacial acetic acid and 1 part by volume of aniline. Surface material was removed from a ground and lapped silicon slice at the rate of about three mils per minute by this solution and a mirror-smooth surface resulted. The corners and edges of the slice were slightly rounded. N-p-n silicon bars emerged from a 25 second initial etch in this solution, i.e., the first etching treatment after the bars have been cut out of the parent crystal, with a mirror-surface, and no definition of the emitter, that is, no difference in the surface appearance of the emitter and collector regions, and no step at the p-layer. The solution used on germanium n-p-n bars etched at the rate of approximately one mil per minute; a mirror surface with a slight cobble-stone effect was produced, and no p-layer acceleration or groove was noted.

*Example II*

An etching solution consisting of thirty parts by volume of concentrated nitric acid, twenty parts by volume of 48% hydrofluoric acid, eighty parts by volume of glacial acetic acid, and one part by volume of aniline was used on a silicon slice. This etching solution removed about one mil per minute and produced a mirror surface.

*Example III*

An etching solution consisting of thirty parts by volume of concentrated nitric acid, twenty parts by volume of 48% hydrofluoric acid, fifty parts by volume of glacial acetic acid, and one part by volume of aniline was used to etch a silicon slice. This solution etched at the rate of two to two and one-half mils per minute and produced a mirror surface. This etching solution used as a second etch (final etch after the leads are attached but before the unit is canned) on a silicon diode produced definite improvements in the electrical properties such as $I_{co}$ and Zener voltage of the finished diodes over diodes etched in other solutions.

*Example IV*

A comparison test was conducted on two groups of p-n junction silicon wafers cut from the same crystal. Group 1 was etched in a standard CP–4 solution without bromine. Group 2 was etched in a solution of 30 parts by volume of concentrated nitric acid, 20 parts by volume of 48% hydrofluoric acid, 60 parts by volume of glacial acetic acid and 1 part by volume of aniline. After 1000 hours shelf aging at 150° C., forward and reverse current for the samples from each group were compared with the following results:

| Reverse Current at 10 volts | Group 1 Wafers (17 samples) | Group 2 Wafers (20 samples) |
|---|---|---|
| less than 0.00001 microamps | 2 (11.8%) | ---------- |
| 0.00001–0.0001 microamps | 5 (29.4%) | 9 (45.0%) |
| 0.0001–0.001 microamps | 5 (29.4%) | 8 (40.0%) |
| 0.001–0.01 microamps | 3 (17.6%) | 2 (10.0%) |
| 0.01–0.1 microamps | 2 (11.8%) | 1 (5.0%) |

All of the samples of group 1 required from 0.772 to 0.81 volt forward voltage to produce a 10 milliampere current flow. Nineteen of the samples of group 2 required from 0.79 to 0.84 volt forward voltage and one sample required 0.99 volt forward voltage to produce the same 10 milliampere current flow.

What is claimed is:

1. A method of etching a surface of an electrical semiconductor which comprises etching said surface in a solution of nitric acid, hydrofluoric acid, acetic acid, and aniline.

2. A method as claimed in claim 1 in which the electrical semiconductor is germanium.

3. A method as claimed in claim 1 in which the electrical semiconductor is silicon.

4. A method as claimed in claim 1 in which the etching is conducted for a period of 25 seconds and then washing the etching solution from said surface.

5. An etching solution for etching the surface of an electrical semiconductor which comprises a solution of nitric acid, hydrofluoric acid, acetic acid, and aniline in the proportion of about 30 parts by volume of concentrated nitric acid, about 20 parts by volume of 48% hydrofluoric acid, about 40 to about 80 parts by volume of glacial acetic acid, and about 1 part by volume of aniline.

6. An etching solution for etching the surface of an electrical semiconductor which comprises a solution of about 30 parts by volume of concentrated nitric acid, about 20 parts by volume of 48% hydrofluoric acid, about 40 parts by volume glacial acetic acid, and about 1 part by volume of aniline.

7. An etching solution for etching the surface of an electrical semiconductor which comprises a solution of about 30 parts by volume of concentrated nitric acid, about 20 parts by volume of 48% hydrofluoric acid, about 50 parts by volume glacial acetic acid, and about 1 part by volume of aniline.

8. An etching solution for etching the surface of an electrical semiconductor which comprises a solution of about 30 parts by volume of concentrated nitric acid, about 20 parts by volume of 48% hydrofluoric acid, about 60 parts by volume glacial acetic acid, and about 1 part by volume of aniline.

9. An etching solution for etching the surface of an electrical semiconductor which comprises a solution of about 30 parts by volume of concentrated nitric acid, about 20 parts by volume of 48% hydrofluoric acid, about 80 parts by volume glacial acetic acid, and about 1 part by volume of aniline.

References Cited in the file of this patent

UNITED STATES PATENTS

| | | |
|---|---|---|
| 2,619,414 | Heidenreich | Nov. 25, 1952 |
| 2,739,882 | Ellis | Mar. 27, 1956 |